United States Patent

Saida et al.

[11] Patent Number: 5,949,102
[45] Date of Patent: Sep. 7, 1999

[54] SEMICONDUCTOR DEVICE HAVING A GATE ELECTRODE WITH ONLY TWO CRYSTAL GRAINS

[75] Inventors: Shigehiko Saida; Yoshio Ozawa, both of Yokohama, Japan

[73] Assignee: Kabushiki Kaisha Toshiba, Kawasaki, Japan

[21] Appl. No.: 08/872,162

[22] Filed: Jun. 10, 1997

[30] Foreign Application Priority Data

Jul. 18, 1996 [JP] Japan .................................. 8-189452

[51] Int. Cl.$^6$ .................................................. H01L 29/76
[52] U.S. Cl. ........................... 257/315; 257/66; 257/153; 257/249; 257/316; 257/317; 257/318; 257/319; 257/320
[58] Field of Search ............................. 257/66, 315–320, 257/349, 350, 353, 374, 412, 627, 741, 756, 382, 397

[56] References Cited

U.S. PATENT DOCUMENTS

| 5,381,032 | 1/1995 | Kokawa et al. | 257/412 |
| 5,525,824 | 6/1996 | Himi et al. | 257/374 |
| 5,600,154 | 2/1997 | Shimizu et al. | 257/66 |

FOREIGN PATENT DOCUMENTS

| 3-173120 | 7/1991 | Japan . |
| 7-99258 | 4/1995 | Japan . |

OTHER PUBLICATIONS

M. Moniwa, et al., "Preferential nucleation along $SiO_2$ steps in amorphous Si", Appl Phys Lett, vol. 47, No. 2, Jul. 15, 1985, pp. 113–115.

*Primary Examiner*—Fetsum Abraham
*Attorney, Agent, or Firm*—Oblon, Spivak, McClelland, Maier & Neustadt, P.C.

[57] ABSTRACT

A semiconductor device comprises a semiconductor substrate, and a plurality of semiconductor elements provided on the semiconductor substrate. Each of the semiconductor elements includes a gate dielectric film formed on the semiconductor substrate, a gate electrode formed on the semiconductor substrate with the gate dielectric film interposed therebetween, and having a pair of side surfaces, and source/drain regions formed in a surface of the semiconductor substrate along the pair of the side surfaces. The gate electrode contains a plurality of crystal grains, and the number of the crystal grains is substantially equal to the number of crystal grains contained in any other gate electrode of all the semiconductor elements.

14 Claims, 11 Drawing Sheets

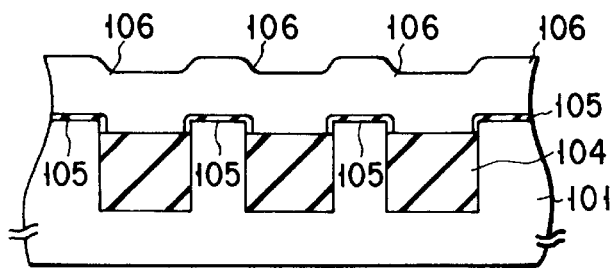
F I G. 6A
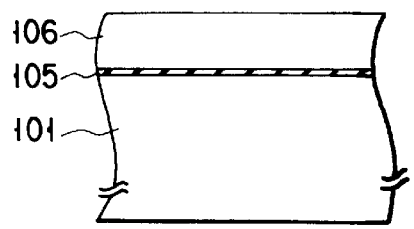
F I G. 6B
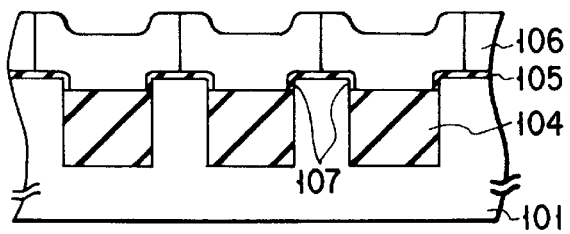
F I G. 7A
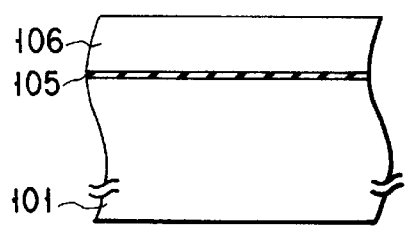
F I G. 7B
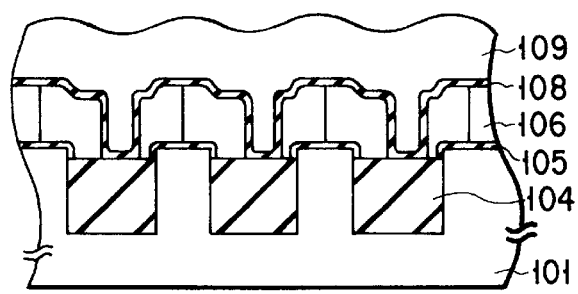
F I G. 8A
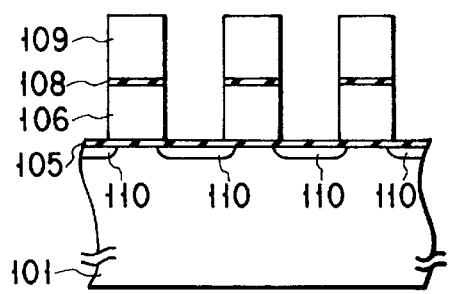
F I G. 8B
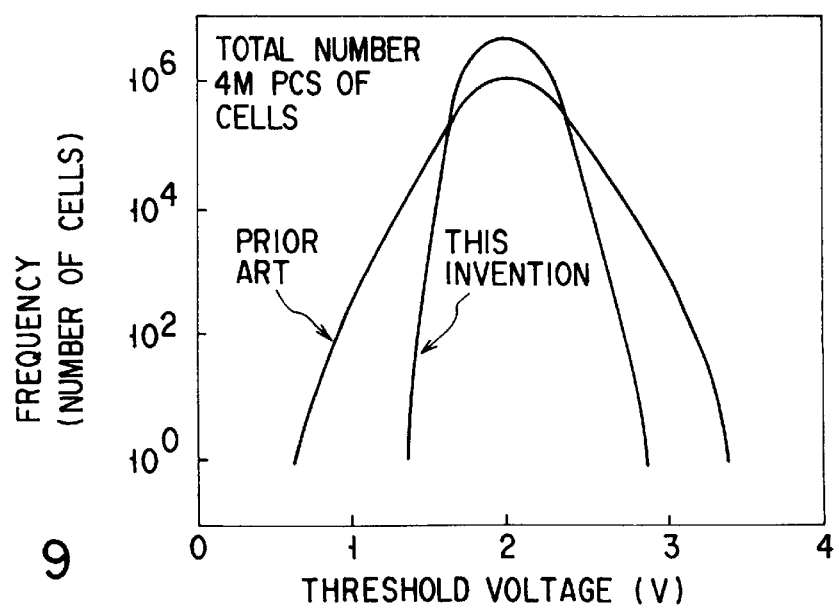
F I G. 9

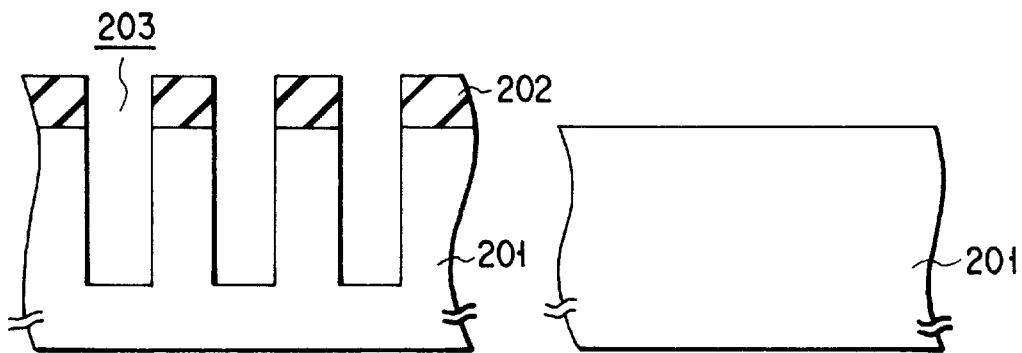
F I G. 10A        F I G. 10B
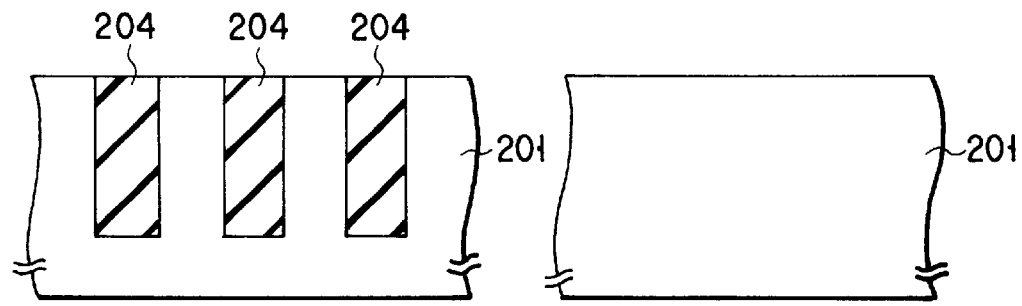
F I G. 11A        F I G. 11B
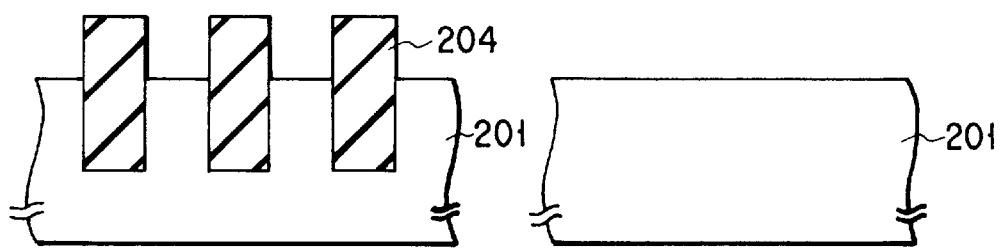
F I G. 12A        F I G. 12B

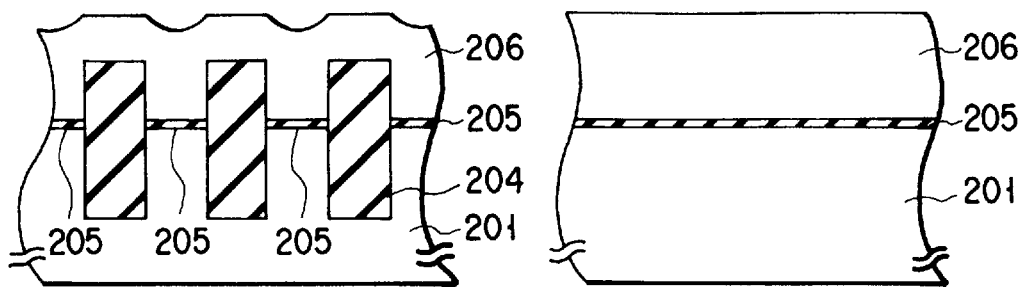
F I G. 1 3 A    F I G. 1 3 B
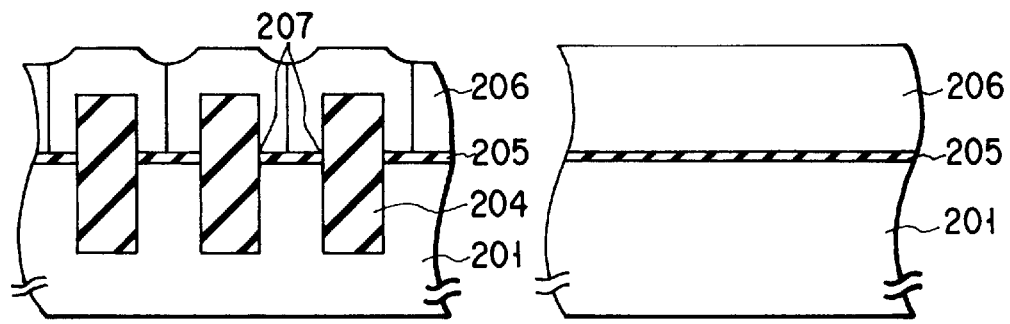
F I G. 1 4 A    F I G. 1 4 B
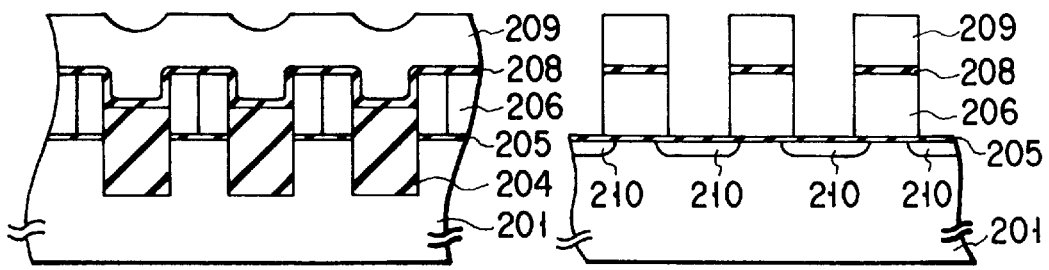
F I G. 1 5 A    F I G. 1 5 B

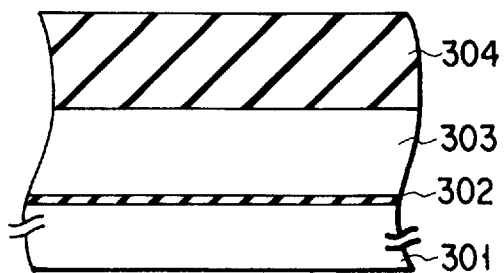
F I G. 16A
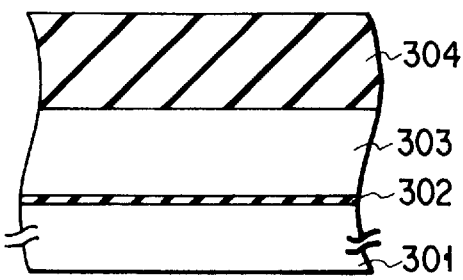
F I G. 16B
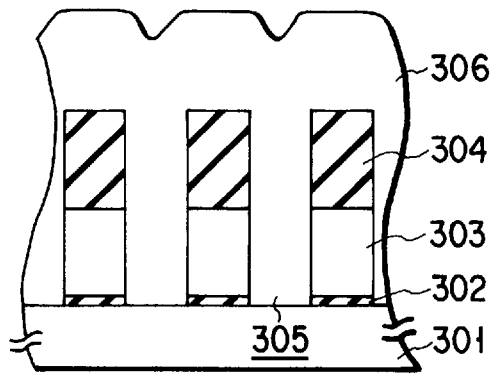
F I G. 17A
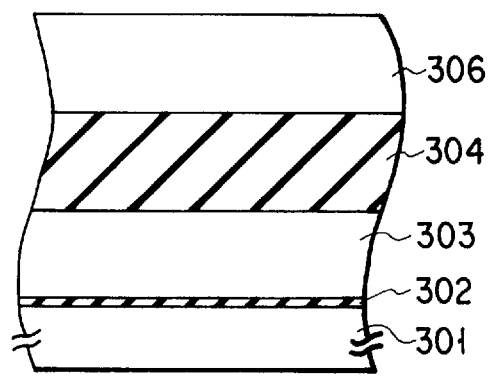
F I G. 17B
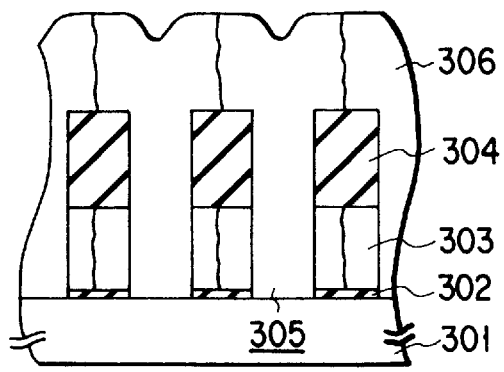
F I G. 18A
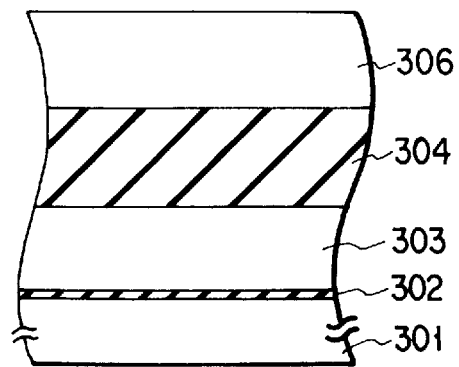
F I G. 18B

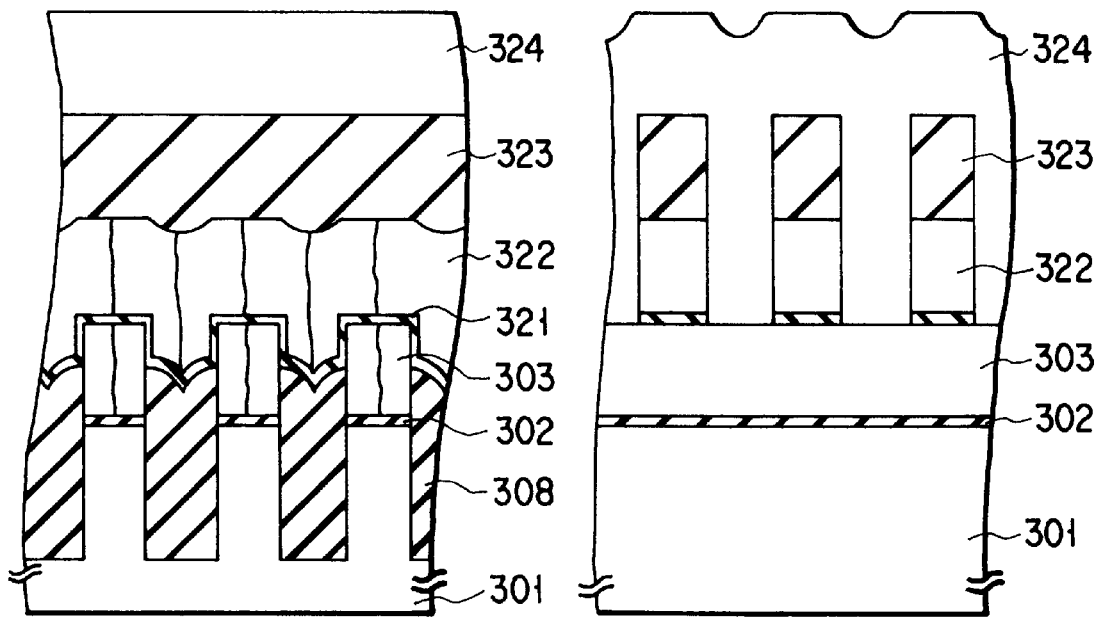
F I G. 27A  F I G. 27B
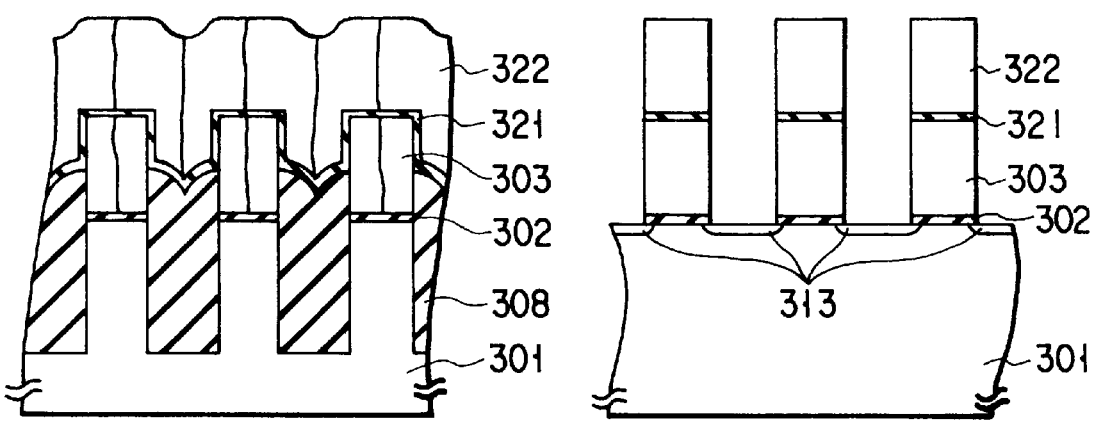
F I G. 28A  F I G. 28B 5,949,102

SEMICONDUCTOR DEVICE HAVING A GATE ELECTRODE WITH ONLY TWO CRYSTAL GRAINS

BACKGROUND OF THE INVENTION

This invention relates to a semiconductor device equipped with a plurality of semiconductor elements of a MOS structure, and to a method for manufacturing the semiconductor device.

In accordance with recent development of semiconductor techniques, in particular, of shrinkage techniques, shrinkage of memory cells, i.e. high integration of a semiconductor device, has been rapidly advanced. As a result, problems have occurred concerning variance in shape (area) between memory cells due to variance in processing or misalignments in lithography.

In particular, in the case of a non-volatile semiconductor memory device such as an EEPROM (Electrically, Erasable Programmable Read Only Memory) having cells of a double gate structure (floating gate/control gate structure), memory cells have variance in coupling ratio C2/(C1+C2) between the electrostatic capacitance C1 of a gate dielectric film interposed between a semiconductor substrate and a floating gate electrode, and the electrostatic capacitance C2 of a dielectric film interposed between the floating gate electrode and a control gate electrode (hereinafter referred to as an "interelectrode dielectric film").

The inventor of this invention previously filed an application directed to an invention capable of effectively reducing the variance in coupling ratio due to lithography or other treatments (Japanese Patent Application No. 7-54791). However, there is not realized effective reduction of the variance in coupling ratio due to those variance in shape among cells (in shape among floating gate electrodes or among control gate electrodes), which is caused since crystal grains contained in a polysilicon film forming the floating gate electrode or the gate electrode are not controlled in number, shape, volume, direction of plane, etc.

FIG. 1A is a schematic sectional view of memory cells incorporated in an EEPROM, showing variance in crystal grain between floating gate electrodes, and variance in shape (gate width) therebetween. For simplifying the figure, a dielectric film (oxide film) incorporated in the EEPROM is not hatched. FIG. 1B is a plan view, taken along lines 1B—1B of FIG. 1A. Further, FIG. 1C is an enlarged view of a 1C portion shown in FIG. 1B.

In FIGS. 1A–1C, reference numeral 1 denotes a p-type silicon substrate, reference numeral 2 an n-type source-drain diffusion layer, reference numeral 3 a tunnel gate oxide film, reference numeral 4 a floating gate electrode, reference numeral 5 an interelectrode dielectric film formed between gate electrodes, reference numeral 6 a control gate electrode, reference numeral 7 a dielectric film for isolation, and reference numeral 11 an interlayer dielectric film. The floating gate electrode 4 and the control gate electrode 6 are formed of polysilicon films. The interelectrode dielectric film 5 consists of an oxide film, a nitride film and another oxide film. Reference numeral 12 denotes the nitride film included in the interelectrode dielectric film 5.

Variance in the number of crystal grains will occur partially because crystal grains in the floating gate electrode 4 are grown during a heat treatment performed after forming of the electrode, and accordingly the number of the grains is varied and protrusions 8 are formed. Another reason for occurrence of such variance is that grain boundaries are oxidized during an oxidation treatment performed after the forming of the electrode, and accordingly retractions 9 are formed. Moreover, grain growth is enhanced by the oxidation process. Yet another reason is that the oxidation speed differs between crystal grains depending upon their orientation, and accordingly the number of the grains is varied and steps 10 are formed.

The above-described variance in the number of crystal grains or in shape (gate width) between semiconductor elements due to the heat treatment, the thermal oxidation treatment or variance in oxidation speed will increase the variance in coupling ratio. Moreover, an oxide film formed directly under the grain boundary has high conductivity (see "Technical Digest of International Electron Devices Meeting 1994, p847), and hence its dielectric characteristics are liable to degrade. Accordingly, where those grain boundaries of the floating gate electrodes 4 which contact the tunnel gate oxide film 3 have different lengths, the amount of current for writing or erasing is liable to vary.

As described above, in the conventional EEPROMs, the number of crystal grains contained in a polysilicon film, which constitutes the floating gate electrode or the control gate electrode, is not controlled. Thus, in the conventional EEPROMs, there is not reduced the range of variance in coupling ratio due to variance in the number of crystal grains between floating gate electrodes or between control gate electrodes.

BRIEF SUMMARY OF THE INVENTION

It is the object of the invention to provide a semiconductor device having a small variance in element characteristics due to variance in the number of crystal grains between gate electrodes, a method for manufacturing the semiconductor device.

According to a first aspect of the invention, there is provided a semiconductor device comprising:

a semiconductor substrate; and a plurality of semiconductor elements provided on the semiconductor substrate, each of the semiconductor elements including:

a gate dielectric film formed on the semiconductor substrate;

a gate electrode formed on the semiconductor substrate with the gate dielectric film interposed therebetween, and having a pair of side surfaces; and source/drain regions formed in a surface of the semiconductor element along the pair of the side surfaces;

wherein the gate electrode contains a plurality of crystal grains, and the number of the crystal grains is substantially equal to the number of crystal grains contained in any other gate electrode of all the plurality of semiconductor elements.

Although in this case, it is most preferable that the number of the crystal grains is equal to the number of crystal grains contained in any other gate electrode of all the semiconductor elements, the object of the invention can be achieved if the former is substantially equal to the latter.

Moreover, the terms "substantially equal" imply not only the fact that the variance in the number of crystal grains is within e.g. 10%, but also positive control of all the semiconductor elements so as to make them have the same number of crystal grains.

Preferably, the number of the crystal grains is set to two.

More preferably, the semiconductor device further comprises a plurality of element isolating regions for isolating adjacent ones of the plurality of semiconductor elements.

Also preferably, there is a step between a surface of each of the element isolating regions and the surface of the semiconductor substrate.

Preferably, the number of the crystal grains is two, and a grain boundary of the two crystal grains is located at a substantially center of a length of that portion of the semiconductor substrate which is situated between corresponding pair of the element isolating regions.

A width of the gate electrode is desirably defined in a state in which the gate electrode is interposed between corresponding pair of adjacent ones of the plurality of element isolating regions.

The crystal grains of all the plurality of semiconductor elements desirably have substantially the same shape and volume.

It is also desirable that the crystal grains of all the plurality of semiconductor elements have substantially the same orientation.

Yet desirably, each of the crystal grains of all the plurality of semiconductor elements has a plane of an angle within ±5° relative to a crystal plane of the semiconductor substrate.

According to a second aspect of the invention, there is provided a semiconductor device comprising:

a semiconductor substrate; and a plurality of semiconductor elements provided on the semiconductor substrate, each of the semiconductor elements including:

a gate dielectric film formed on the semiconductor substrate;

a floating gate electrode formed on the semiconductor substrate with the gate dielectric film interposed therebetween;

an interelectrode dielectric film formed on the floating gate electrode a control gate electrode formed on the interelectrode dielectric film; and source/drain regions formed in a surface of the semiconductor element along the both sides of the floating gate electrode;

wherein at least one of the floating gate electrode and the control gate electrode contains a plurality of crystal grains, and the number of the crystal grains contained in the at least one of the floating gate electrode and the control gate electrode is substantially equal to the number of crystal grains contained in any other corresponding one of the floating gate electrodes and the control gate electrodes of all the plurality of semiconductor elements.

Preferably, the number of the crystal grains is set to two.

More preferably, the semiconductor device further comprises a plurality of element isolating regions for isolating adjacent ones of the plurality of semiconductor elements.

Preferably, the number of the crystal grains is two, and the grain boundary of the two crystal grains is located at a substantially center of a length of that portion of the semiconductor substrate which is situated between corresponding pair of the plurality of element isolating regions.

The crystal grains of all the plurality of semiconductor elements desirably have substantially the same shape and volume.

It is also desirable that the crystal grains of all the plurality of semiconductor elements have substantially the same orientation.

Yet desirably, each of the crystal grains of all the plurality of semiconductor elements has a plane of an angle within ±5° relative to a crystal plane of the semiconductor substrate.

According to a third aspect of the invention, there is provided a method of producing a semiconductor device comprising the steps of:

forming a dielectric film on a crystallized semiconductor substrate;

forming a first amorphous film on the dielectric film;

forming a mask pattern on the first amorphous film, to form a plurality of grooves reaching the crystallized semiconductor substrate using the mask pattern as an etching mask;

forming a second amorphous film on those portions of the crystallized semiconductor substrate and the fist amorphous film which are exposed through the grooves;

crystallizing at least those portions of the second amorphous film which contact the first amorphous film, using the crystallized semiconductor substrate as a seed crystal, and crystallizing the first amorphous film using the crystallized portions of the second amorphous film; and etching the overall second amorphous film to remove the same using the mask pattern as an etching mask, and etching the crystallized semiconductor substrate to form element isolating grooves in the crystallized semiconductor substrate.

It is preferable that the first amorphous film is a doped film, and the second amorphous film is an undoped film.

It is further preferable that the first and the second amorphous film is made of the same semiconductor material as that of the crystallized semiconductor substrate, and that the semiconductor material is silicon.

It is preferable that the first and second amorphous films are made of the same material. When in this case, the crystallized second amorphous film is used as a seed crystal to crystallize the first amorphous film, the number, the shapes, etc. of crystal grains can easily be controlled since they have the same lattice constant.

Since in the invention, all the semiconductor elements have gate electrodes (floating gate electrodes or control gate electrodes) which contain substantially the same number of crystal grains, the variance in element characteristics due to variance in the number of crystal grains is reduced.

The semiconductor device according to the second aspect of the invention can also provide the following advantages:

In particular, the variance in coupling ratio due to variance in the number of crystal grains is reduced. Further, since variance in the number of crystal grains are restrained and the number of crystal grains contained in each gate electrode is set to two, deterioration of the gate dielectric film located directly below the boundaries of the crystal grains can be minimized. Accordingly, if the invention is applied to a memory such as an EEPROM, variance in the amount of write/read current can be effectively restrained.

It is known that grain growth generally implies usual grain growth caused by high energy at a grain boundary, and secondary grain growth caused by differences in interface energy between crystal grains and an oxide film due to differences in orientation between the crystal grains (see J. Appl. Phys., Vol. 58, p. 763, 1987).

Since in the invention, all the semiconductor elements are substantially identical in terms of the number of crystal grains contained therein and in terms of crystal grain shape and volume, variance in boundary energy and volume energy of crystal grains are minimized. The smaller the variance in grain boundary energy, the smaller the variance in grain growth. Accordingly, the invention can effectively reduce the variance in shape and volume among crystal grains due to variance in grain growth relating especially to the amount of grain boundary energy. Therefore, if the invention is applied to a memory such as an EEPROM, variance in shape among memory cells can be restrained, thereby effectively reducing the variance in coupling ratio.

Moreover, since in the invention, the gate electrodes of all the semiconductor elements are substantially identical in terms of the number of crystal grains contained therein and in terms of the orientation of crystal grains, the variance in interface energy due to variance in orientation of crystal grains is small. Therefore, the invention effectively reduces the variance in shape and volume among crystal grains due to variance in grain growth relating especially to the interface energy. If the invention is applied to a memory such as an EEPROM, variance in shape among memory cells can be restrained, thereby effectively reducing the variance in coupling ratio.

Furthermore, the invention can reduce the variance in threshold voltage due to variance in work function relating to differences in orientation of crystal grains. The invention also reduces the variance in the number of crystal grains and in crystal grain shape and volume (size) due to dependency, upon the orientation of crystal grain, of the speed of oxidation in the oxidation process performed after the forming of the gate electrode.

In addition, since in the invention, those portions of the crystallized semiconductor substrate in which element isolating grooves are formed are used as seed regions, it is not necessary to secure any particular portions to be used as the seed regions, thereby reducing the area required for each element.

Lastly, since in the invention, the etching mask used to form grooves reaching the crystallized semiconductor substrate is used to form the element isolating grooves, the required number of process steps is small.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 9 is a graph, useful in explaining the difference between the threshold voltage distribution of memory cells employed in the first embodiment, and that of memory cells employed in the conventional case;

FIGS. 10A, 11A, . . . , 15A are views, useful in explaining, in a stepwise manner, a method for manufacturing NAND type EEPROM cells of a second embodiment, and corresponding to the sectional views taken along lines 8A—8A of FIG. 2;

FIGS. 10B, 11B, . . . , 15B are views, useful in explaining, in a stepwise manner, the method for manufacturing the NAND type EEPROM cells of the second embodiment, and corresponding to the sectional views taken along lines 8B—8B of FIG. 2;

FIGS. 16A, 17A, . . . , 21A are views, useful in explaining, in a stepwise manner, a method for manufacturing NAND type EEPROM cells of a third embodiment, and corresponding to the sectional views taken along lines 8A—8A of FIG. 2;

FIGS. 16B, 17B, . . . , 21B are views, useful in explaining, in a stepwise manner, the method for manufacturing the NAND type EEPROM cells of the third embodiment, and corresponding to the sectional views taken along lines 8B—8B of FIG. 2;

FIGS. 25A, 26A, 27A and 28A are views, useful in explaining, in a stepwise manner, a method for manufacturing NAND type EEPROM cells of a fourth embodiment, and corresponding to the sectional views taken along lines 8A—8A of FIG. 2;

FIGS. 25B, 26B, 27B and 28B are views, useful in explaining, in a stepwise manner, the method for manufacturing the NAND type EEPROM cells of the fourth embodiment, and corresponding to the sectional views taken along lines 8B—8B of FIG. 2.

DETAILED DESCRIPTION OF THE INVENTION

The embodiments of the invention will be described in detail with reference to the accompanying drawings. (First Embodiment)

Figure 1A:
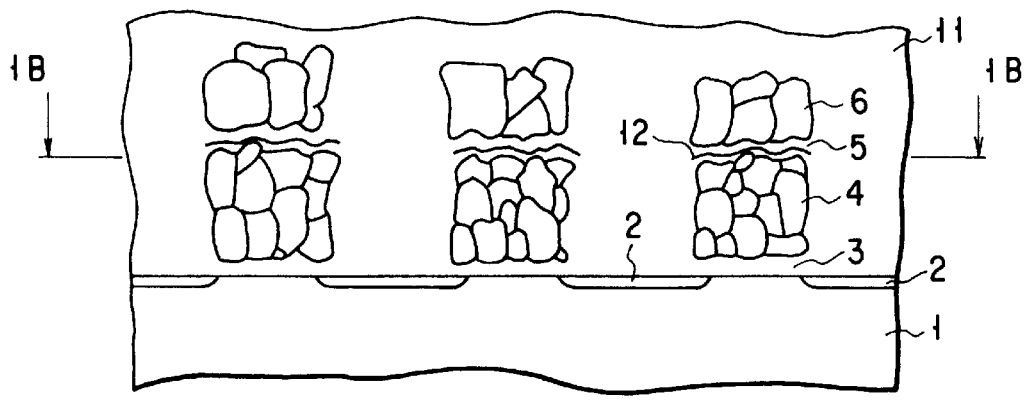
FIG. 1A is a schematic sectional view, showing variance in crystal grain and shape between conventional floating gate electrodes.
Figure 1B:
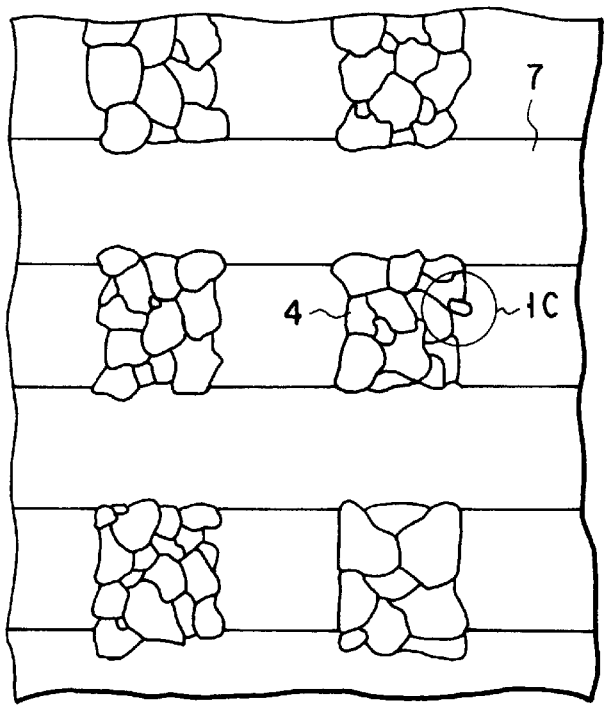
FIG. 1B is a plan view, cut away along lines 1B—1B of FIG. 1A.
Figure 1C:
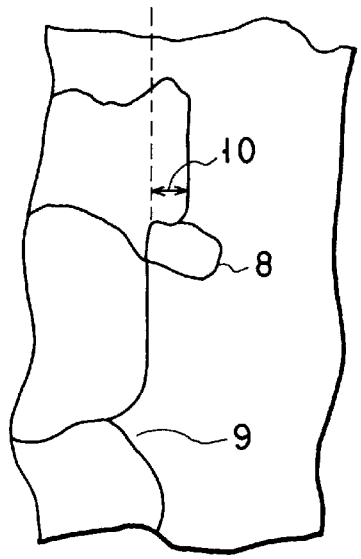
FIG. 1C is an enlarged view of a portion 1C shown in FIG. 1B.
Figure 2:
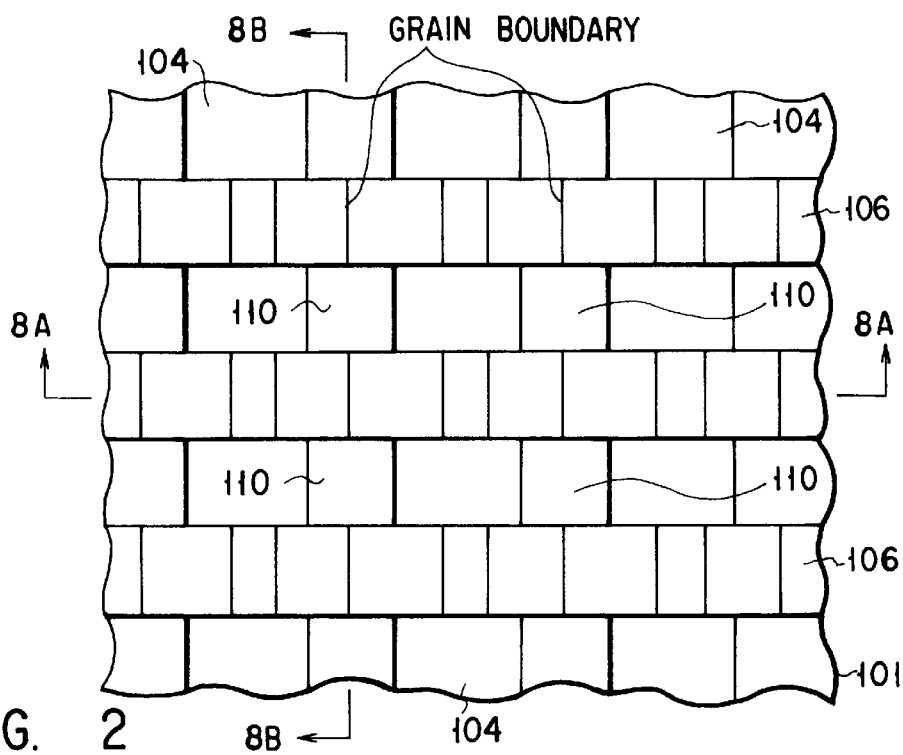
FIG. 2 is a schematic plan view, showing NAND type EEPROM memory cells according to a first embodiment of the invention and one aspect on the way of manufacturing process thereof.
Figures 3A, 3B:
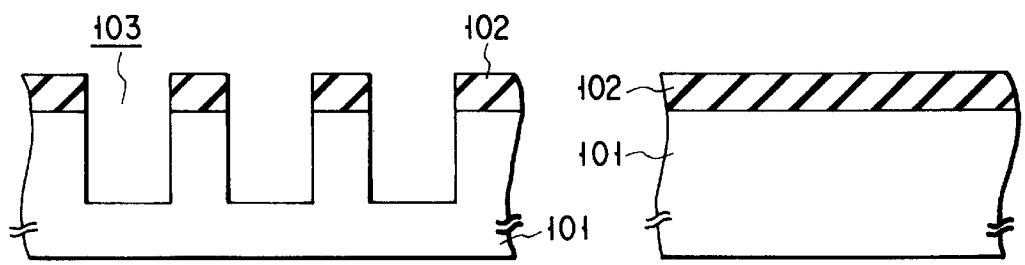
FIGS. 3A, 4A, . . . , 8A are views, useful in explaining, in a stepwise manner, a method for manufacturing the NAND type EEPROM cells of the first embodiment, and corresponding to sectional views taken along lines 8A—8A of FIG. 2.
FIGS. 3B, 4B, . . . , 8B are views, useful in explaining, in a stepwise manner, the method for manufacturing the NAND type EEPROM cells of the first embodiment, and corresponding to sectional views taken along lines 8B—8B of FIG. 2.
Figures 4A, 4B:
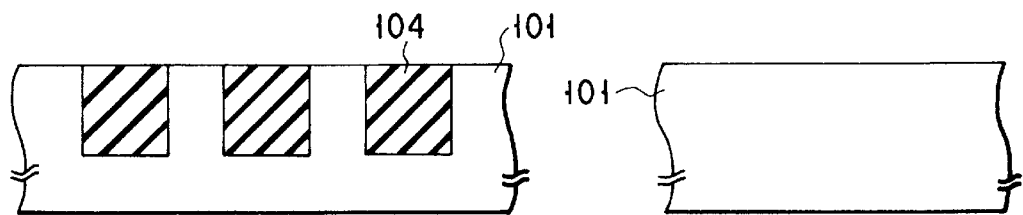

FIG. 2 is a plan view, showing NAND type EEPROM memory cells according to a first embodiment of the invention and one aspect on the way of manufacturing process thereof. FIGS. 3A, 4A, . . . , 8A and FIGS. 3B, 4B, . . . , 8B are views, useful in explaining, in a stepwise manner, a method for manufacturing the NAND type EEPROM cells of the first embodiment, and respectively corresponding to sectional views taken along lines 8A—8A and 8B—8B of FIG. 2. FIG. 2 is a schematic plan view at the step shown in FIGS. 8A and 8B.

As shown in FIGS. 3A and 3B, an oxide film with a thickness of 100 nm, of which a mask pattern 102 for forming element isolation grooves is formed, is provided, by thermal oxidation, on the overall surface of a p-type silicon substrate 101 (which has, for example, a resistivity of 10 Ωcm and a crystal plane (100)). Subsequently, the oxide film is patterned to form the mask pattern 102, and the p-type silicon substrate 101 is etched vertically by reactive ion etching, using the mask pattern 102 as a mask, thereby forming element isolation grooves 103 with a depth of 0.5 $\mu$m in the p-type silicon substrate 101.

As is shown in FIGS. 4A and 4B, an oxide film 104 with a thickness of 200 nm which serves as an element isolation film is deposited on the overall surface of the resultant structure by chemical vapor deposition (CVD), so as to fill the element isolation grooves 103. Then, the overall surface is polished until the silicon substrate 101 is exposed.

Figures 5A, 5B:
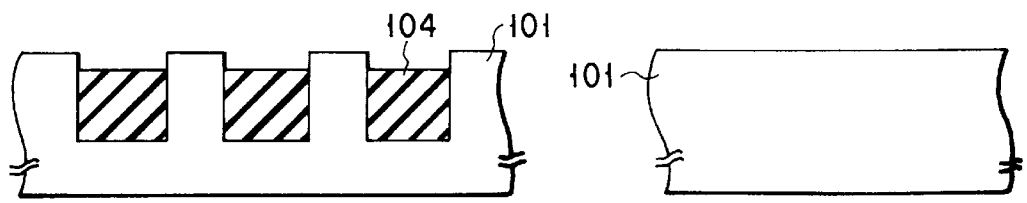

Thereafter, as is shown in FIGS. 5A and 5B, part of the upper surface of the oxide film 104 is etched using a buffered hydrofluoric acid solution, thereby forming a step with a height of 50 nm between the oxide film 104 and the substrate 101. The substrate surface may be thermally oxidized before etching.

Referring then to FIGS. 6A and 6B, a tunnel gate oxide film 105 with a thickness of 10 nm is formed on the substrate surface by thermal oxidation, and then an amorphous silicon film 106 with a thickness of 300 nm, which will constitute floating gate electrodes, is deposited by CVD. At the time of depositing the silicon film 106, silane is used as its material, and the temperature of the substrate is set to e.g. 525° C.

As is shown in FIGS. 7A and 7B, the resultant structure is heated at 600° C. in the atmosphere of $N_2$ for 12 hours, to thereby crystallize the amorphous silicon film 106 to have a polycrystalline structure. At this time, crystallization of the amorphous silicon film 106 starts from a corner portion 107 thereof located between the oxide film 104 and the substrate 101.

As a result, the variance in the number of crystal grains between those portions of the polysilicon film 106 which will constitute floating gate electrodes, in the number of grain boundaries between the above portions of the film 106 and the other portions of the film 106, and in grain boundary length between the tunnel gate oxide film 105 and the above portions of the polysilicon film 106 are significantly reduced.

For example, since the density of crystalline nucleuses is about 0.5 per 1 $\mu$m and the gate length of the memory cell is 0.2 $\mu$m, about 90% of all memory cells each have two crystalline nuclei, because there is formed a single crystalline nucleus at each corner portion 107 of each memory cell. Thus, the variance in memory cell shape and hence in coupling ratio can be reduced.

In addition, since in the first embodiment, the number of crystal grains is two, degradation of the tunnel gate oxide film 105 located directly below the grain boundary can be minimized, with the result that variance in the amount of current for writing and erasing can effectively be restrained.

Thereafter, as is shown in FIGS. 8A and 8B, the crystallized silicon film (polysilicon film) 106 is etched by reactive ion etching to form floating gate electrodes, and then a three-layer dielectric film 108 as an interelectrode dielectric film is formed on each floating gate electrode 106. Specifically, the three-layer dielectric film 108 is formed, by CVD, an oxide film with a thickness of 5 nm, a nitride film with a thickness of 6 nm and another oxide film with a thickness of 5 nm in this order.

Then, a polysilicon film 109 with a thickness of 300 nm, which is doped with an impurity and will constitute control gate electrodes, is formed by CVD. At the time of forming the polysilicon film 109, SiH4, for example, is used as the material thereof, the substrate temperature is set to 620° C., and the addition of the impurity is made by diffusing an impurity such as $POCl_3$ into the film 109.

The polysilicon film 109 is then etched by reactive ion etching to form control gate electrodes, and the three-layer dielectric film 108 is etched by reactive ion etching to form interelectrode dielectric films. Further, the ploysilicon film 106 is etched by reactive ion etching to form floating gate electrodes.

Thereafter, n-type source/drain regions are formed in a self-alignment manner by ion-implanting arsenic, for example, as an n-type impurity, into the substrate surface, using the control gate electrodes 109 as masks. Since at this time, grain boundaries located between the floating gate electrodes 106 of the memory cells and the tunnel gate oxide films 105 have substantially the same length, variance in characteristics among the tunnel gate oxide films 105 due to the diffusion of the n-type impurity into the films 105 are significantly restrained.

Lastly, a heat treatment is performed in the atmosphere of oxygen of 850° C. for activating the impurity, thus completing the NAND type EEPROM memory cell array.

FIG. 9 is a graph, comparing the threshold voltage distribution of memory cells produced by the method according to the first embodiment of the invention, with that of memory cells produced by the conventional method in which a polysilicon film constituting floating gate electrodes is directly formed. As is evident from FIG. 9, the memory cells produced by the method of the first embodiment show an extremely small variation in threshold voltage, as compared with the memory cells produced by the conventional method.

This is because in the above-described embodiment of the invention, the variance in the number of crystal grains between the floating gate electrodes is sufficiently small, with the result that the variance in shape between crystal grains due to the heat treatment and the oxidation treatment performed after forming of memory cells is extremely small, and the variance in grain boundary length between the memory cells is also small.

(Second Embodiment)

A method for producing a NAND type EEPROM memory cell array according to a second embodiment will now be described. The plan view of this memory cell array is similar to that shown in FIG. 2. FIGS. 10A, 11A, . . . , 15A and FIGS. 10B, 11B, . . . , 15B are views respectively corresponding to the sectional views taken along lines 8A—8A and 8B—8B of FIG. 2, and illustrating the method in a stepwise manner. In this case, FIG. 2 schematically corresponds to a plan view at the step shown in FIGS. 15A and 15B.

The method of the second embodiment can make floating gate electrodes substantially identical not only in terms of the number of crystal grains contained therein, but also in terms of crystal grain shape and volume (size).

First, as is shown in FIGS. 10A and 10B, an oxide film with a thickness of 100 nm, of which a mask pattern 202 is formed for element isolation grooves, is provided, by thermal oxidation, on the overall surface of a p-type silicon substrate 201 (which has, for example, a resistivity of 10 Ωcm and a crystal plane (100)). Subsequently, the oxide film is patterned to form the mask pattern 202 for element isolation grooves, and the p-type silicon substrate 201 is etched vertically by reactive ion etching, using the mask pattern 202 as a mask, thereby forming element isolation grooves 203 with a depth of 0.6 µm in the p-type silicon substrate 201.

As is shown in FIGS. 11A and 11B, an oxide film 204 with a thickness of 200 nm which serves as an element isolation film is deposited on the overall surface of the resultant structure by chemical vapor deposition (CVD), so as to fill the element isolation grooves 203. Then, the overall surface is polished until the silicon substrate 201 is exposed.

Thereafter, as is shown in FIGS. 12A and 12B, part of the upper surface of the oxide film 204 is etched, thereby forming a step with a height of 150 nm between the oxide film 204 and the substrate 201.

Referring then to FIGS. 13A and 13B, a tunnel gate oxide film 205 with a thickness of 10 nm is formed on the substrate surface by thermal oxidation, and then an amorphous silicon film 206 with a thickness of 300 nm, which will constitute floating gate electrodes, is deposited by CVD. At the time of depositing the silicon film 106, silane is used as its material, and the temperature of the substrate is set to e.g. 525° C.

As is shown in FIGS. 14A and 14B, the resultant structure is heated at 600° C. in the atmosphere of $N_2$ for 12 hours, to thereby crystallize the amorphous silicon film 206 to have a polycrystalline structure. At this time, crystallization of the amorphous silicon film 206 starts from each corner portion 207 thereof located between the oxide film 204 and the oxide film 205, and hence the grain boundaries of the crystallized silicon film (polysilicon film) 206 are formed at center portions of element regions.

Thereafter, as is shown in FIGS. 15A and 15B, the silicon film 206 is polished by a chemical mechanical polishing method using the oxide film 204 as an etching stopper, thereby forming floating gate electrodes in a self alignment manner. Thereafter, that upper portion of the oxide film 204 which has a thickness of 100 nm is removed therefrom.

Since the crystallization of the amorphous silicon film 206 starts from the corner portion 207 and the floating gate electrodes 206 are formed in a self alignment manner without using a photo-lithography technique, the floating gate electrodes can be made substantially identical not only in terms of the number of crystal grains contained therein, but also in terms of crystal grain shape and volume (size). In other words, all memory cells can be made substantially identical in terms of the number of crystal grains contained in the floating gate electrode and in terms of crystal grain shape and volume.

The smaller the variance in shape and volume (size) among crystal grains, the smaller the variance in energy among grain boundaries and volume energy of crystal grains. The smaller the variance in energy among grain boundaries, the smaller the variance in growth among crystal grains. Accordingly, the variance in shape among memory cells due to variance in grain growth relating to the amount of energy is small.

Thus, the second embodiment of the invention can reduce not only variance in shape among memory cells due to variance in the number of grain boundaries, but also variance in shape among memory cells due to variance in grain growth relating to the amount of energy. In addition, it can more effectively reduce variance in coupling ratio than the first embodiment.

Thereafter, a three-layer dielectric film 208 as an interelectrode dielectric film is formed on each floating gate electrode 206. Specifically, the three-layer dielectric film 208 is formed, by CVD, an oxide film with a thickness of 5 nm, a nitride film with a thickness of 6 nm and another oxide film with a thickness of 5 nm in this order.

Then, a polysilicon film 209 with a thickness of 300 nm, which is doped with an impurity and will constitute control gate electrodes, is formed by CVD. At the time of forming the polysilicon film 209, $SiH_4$, for example, is used as the material thereof, the substrate temperature is set to 620° C., and the addition of the impurity is performed by diffusing an impurity such as $POCl_3$ into the film 209.

The polysilicon film 209 is then etched by reactive ion etching to form control gate electrodes, and the three-layer dielectric film 208 is etched by reactive ion etching to form interelectrode dielectric films. Further, the polysilicon film 206 is etched by reactive ion etching to form floating gate electrodes.

Lastly, n-type source/drain regions 210 are formed in a self alignment manner by ion-implanting arsenic ions as n-type impurity ions into the substrate surface, using the control gate electrodes 209 as masks, and the resultant structure is heated in the atmosphere of oxygen of 850° C. to activate the impurity ions, thus completing the NAND type EEPROM memory cell array.

(Third Embodiment)

A method for producing a NAND type EEPROM memory cell array according to a third embodiment will now be described. The plan view of this memory cell array is similar to that shown in FIG. 2. FIGS. 16A, 17A, . . . , 21A and FIGS. 16B, 17B, . . . , 21B are sectional views respectively corresponding to the sectional views taken along lines 8A—8A and 8B—8B of FIG. 2, and illustrating the method in a stepwise manner. In this case, FIG. 2 schematically corresponds to a plan view at the step shown in FIGS. 21A and 21B.

The method of the third embodiment can make floating gate electrodes substantially identical in terms of the number of crystal grains contained therein and in terms of crystal grain shape and volume. Furthermore, the method can make the crystal grains have substantially the same orientation.

First, as is shown in FIGS. 16A and 16B, a tunnel gate oxide film 302 with a thickness of 10 nm is formed, by thermal oxidation, on the overall surface of a p-type silicon substrate 301 (which has, for example, a resistivity of 10 Ωcm and a crystal plane (100)). Subsequently, a first amorphous silicon film 303 with a thickness of 300 nm, of which floating gate electrodes will be formed, is provided on the tunnel gate oxide film 302 by CVD, and an oxide film 304 with a thickness of 300 nm which will serve as an etching mask is formed on the amorphous silicon film 303 by atmopheric-pressure CVD.

At the time of depositing the silicon film 303, $SiH_4$, for example, is used as its material, and the substrate temperature is set to e.g. 525° C. Moreover, an impurity (e.g. P, B or As) may be implanted into the silicon film 303. The concentration of the impurity is set, for example, to $1\times10^{20}$ $cm^{-3}$.

As is shown in FIGS. 17A and 17B, the oxide film 304 is patterned, and used as masks to etch the amorphous silicon film 303 and the tunnel gate oxide film 302 by reactive ion etching perpendicular to the substrate surface, so as to expose those regions of the substrate surface in which dielectric films for isolating are formed. As a result, grooves 305 are formed. Then, a second amorphous silicon film 306 with a thickness of e.g. 300 nm is deposited, by CVD, on the overall structure so as to fill the grooves 305 and reach a certain level above the oxide film 304.

In place of the second amorphous silicon film 306, another amorphous film may be used. However, silicon is advantageous in that it has the same lattice constant as the silicon substrate 301, and therefore that crystal grain properties (e.g. the number of crystal grains, the shape of each crystal grain, etc.) can easily be controlled.

At the time of depositing the silicon film 306, the material and the substrate temperature may be identical to those employed to form the first amorphous silicon film 303. In addition, it is preferable that the silicon film 306 is undoped, since if an impurity such as P, B or As is injected therein, it is highly possible that the impurity contained in the silicon film 306 is diffused into the substrate 301 to thereby change the threshold voltage.

Subsequently, as is shown in FIGS. 18A and 18B, the resultant structure is heated in the atmosphere of $N_2$ of 600° C. for 12 hours, thereby crystallizing the first and second amorphous silicon films 303 and 306 to form epitaxial layers.

At this time, the second amorphous silicon film 306 is crystallized, using, as seed crystals, those exposed surface portions of the substrate 301 on which element isolating films will be formed. On the other hand, the first amorphous silicon films 303 (which will constitute the floating gate electrodes) are crystallized using the second amorphous silicon film 306 as a seed crystal.

Since as described above, those exposed surface portions of the substrate 301 on which the element isolating films are formed are used as seed crystals, it is not necessary to secure other portions used as seed crystals, which contributes to reduction of the element area.

The above-described crystallization using exposed substrate surface portions as seed crystals can make the floating gate electrodes 303 substantially identical in terms of the number of crystal grains contained therein and in terms of crystal grain shape and volume (size), and further can make the orientation of crystal grain of each floating gate electrode substantially identical to the orientation (e.g. (100)) of the substrate. In other words, the floating gate electrodes of all the memory cells are substantially identical in terms of the number of crystal grains contained therein and in terms of crystal grain shape, volume (size) and orientation of crystal grains. It was confirmed that variance in orientation among crystal grains contained in each floating gate electrode 303 fall within ±5° relative to orientation of the substrate.

Thus, the smaller the variance in orientation among grain boundaries, the smaller the variance in energy among grain boundaries. The smaller the variance in energy among grain boundaries, the smaller the variance in growth among crystal grains. Accordingly, the variance in shape among memory cells due to variance in grain growth relating to the amount of grain boundary energy is small.

As described above, the third embodiment can reduce not only the variance in shape among memory cells due to variance in the number of grain boundaries, but also the variance in shape among memory cells due to variance in grain growth relating to the amount of grain boundary energy, thereby more effectively reducing the variance in coupling ratio than the second embodiment.

Moreover, the third embodiment can also reduce the variance in threshold voltage based on variance in work function due to variance in direction of crystal plane. In addition, in the oxidation process performed after the gate electrodes are formed, the third embodiment can reduce the variance in the number of crystal grains and in crystal grain shape and volume (size) due to dependence of oxidation speed upon the orientation of crystal grains, thereby reducing the variance in shape among memory cells.

If in the crystallization process, oxidation is performed, after an upper portion of the silicon film 306 is removed until upper corner portions of the oxide films 304 are exposed, crystallization from the upper corner portions of the films 304 can be avoided.

Although in the third embodiment, the entire second amorphous silicon film 306 is crystallized, the invention is not limited to this. It suffices if at least those portions of the second amorphous silicon film 306 which contact the first amorphous silicon films 303 are crystallized.

Figure 19A:
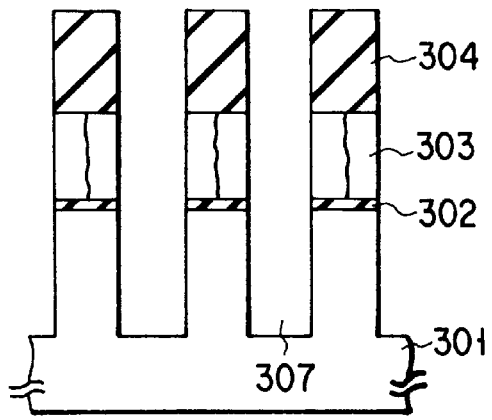
Figure 19B:
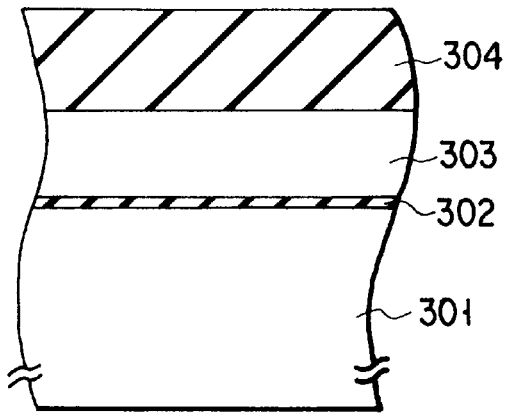

Thereafter, as is shown in FIGS. 19A and 19B, the oxide films 304 having been used as the etching masks at the time of forming the grooves 307 are again used as etching masks to vertically etch, by reactive ion etching, the silicon film 306 and the substrate 301 in this order, to thereby form element isolation grooves 307 and remove the silicon film 306.

Since as described above, the oxide films 304 having been used as the etching masks at the time of forming the grooves 307 are again used as etching masks to form the element isolating grooves 307, it is not necessary to form a particular etching mask to form the element isolating grooves 307, thereby minimizing the number of required processes.

At this time, it is preferable to perform the reactive ion etching after flattening the surface of the resultant structure by a chemical mechanical polishing method or the etch back method until the surfaces of the oxide films 304 are exposed. This can prevent occurrence of residue on the side surfaces of the silicon film 303 at the time of reactive ion etching.

Where the bottom of a concave portion formed on the upper surface of the silicon film 306 is located below the upper surface of the oxide films 304, the etch back can be performed until the surface of the silicon film 306 is flattened, after a film of the same etching rate as that of the silicon film 306 is deposited on the silicon film 306.

Further, where a seam occurs in the silicon film 306 below the upper surface of the oxide films 304, it is preferable to perform the etch back until the seam is completely removed. If, at this time, a seam appears, it is preferable to deposit a film of the same etching rate as that of the silicon film 306 so as to fill the seam and create a flat surface, and thereafter to perform etch back again.

From the point of view of preventing deposition of a reactive product, it is desirable to use, as etching species, HCl or HBr, for example, which does not contain oxygen, or a mixture of HCl or HBr and $SF_6$. In other words, the etching species should have properties which will cause relatively low anisotropy in reactive ion etching. The reason for preventing occurrence of a reactive product is that if the reactive product is created in the silicon film 306, it may well serve as a mask and make part of the silicon film 306 remain on a side wall portion of the grooves 307.

In the third embodiment, the silicon film 306 is formed thick. If the film 306 is formed thin, it is possible that a seam occurs in the film 306. In this case, the conditions of reactive ion etching are adjusted so as not to make part of the film 306 remain on a side wall portion of the grooves 307.

Alternatively, the seam may be removed by iso-tropically etching the silicon film 306 using chemical dry etching, thereafter etching the film 306 by reactive ion etching.

Figure 20A:
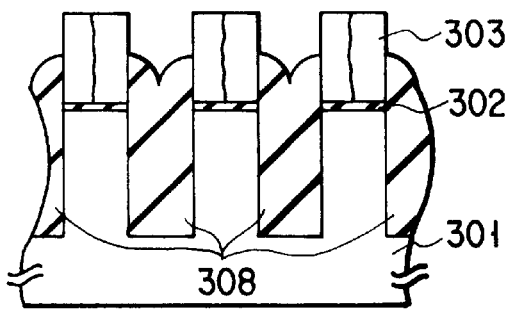
Figure 20B:
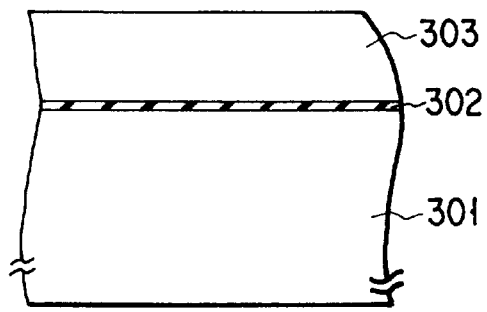

Subsequently, as is shown in FIGS. 20A and 20B, a thick (e.g. 400 nm) oxide film 308 which serves as a dielectric film for isolation is deposited by CVD, and the resultant structure is etched back, thereby making the oxide film 308 remain only in the element isolating grooves 307 and removing the oxide films 304.

Figure 21A:
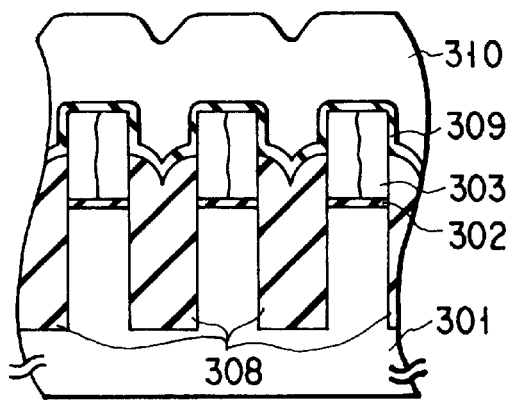
Figure 21B:
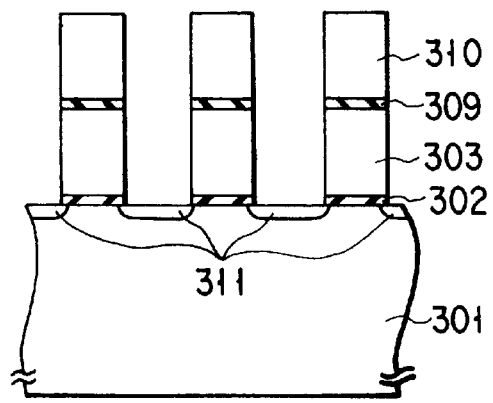

Thereafter, as is shown in FIGS. 21A and 21B, a three-layer dielectric film 309 which will constitute an interelectrode dielectric film is formed on the floating gate electrodes 303. Specifically, the three-layer dielectric film 309 consists of an oxide film with a thickness of 5 nm, a nitride film with a thickness of 6 nm and another oxide film with a thickness of 5 nm, which are deposited in this order.

Then, a polysilicon film 310 with a thickness of 300 nm, which is doped with an impurity and will constitute control gate electrodes, is deposited by CVD. At the time of forming the polysilicon film 310, $SiH_4$, for example, is used as the material thereof, the substrate temperature is set to 620° C., and the addition of the impurity is made by diffusing an impurity such as $POCl_3$ into the film 310.

The polysilicon film 310 is then etched by reactive ion etching to form control gate electrodes, and the three-layer dielectric film 309 is etched by reactive ion etching to form interelectrode dielectric films. Further, the polysilicon film 303 is etched by reactive ion etching to form floating gate electrodes.

Lastly, n-type source/drain regions 311 are formed in a self-alignment manner by implanting, for example, arsenic ions as n-type impurity ions into the substrate surface using the control gate electrodes 303 as masks, and then a heat treatment is performed in the atmosphere of oxygen of 850° C. to activate the impurity, thus completing the NAND type EEPROM memory cell array.

In the third embodiment, the grooves 305 and 307 are formed by vertical etching with respect to the substrate surface. In this method, however, it is possible that part of the silicon film 306 which is not etched will be left on a side wall portion of the grooves, and hence that the substrate 301 cannot completely be isolated from the floating gate electrodes 303.

Figure 22A:
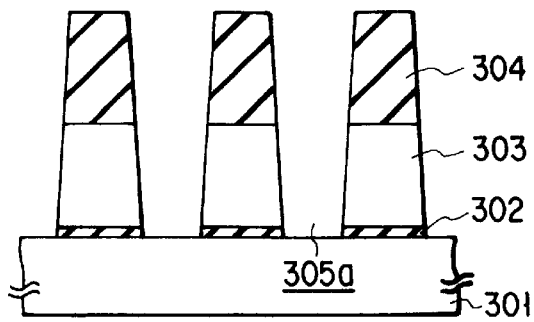
FIGS. 22A and 22B are views, useful in explaining, in a stepwise manner, a modification of the method for manufacturing NAND type EEPROM cells according to the third embodiment.
Figure 22B:
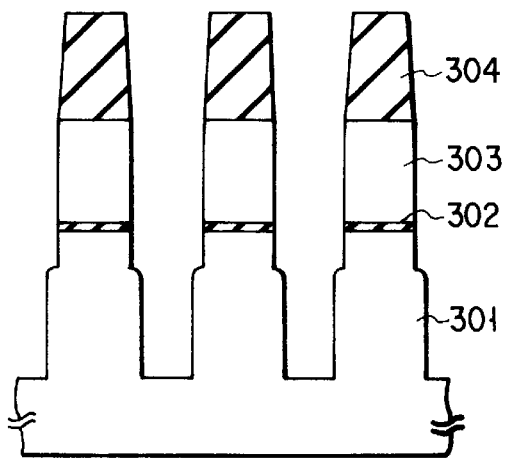

There is a method for completely isolating the floating gate electrodes from the substrate, in which tapered grooves 305a are formed, in the process shown in FIGS. 17A and 17B, by performing oblique etching with respect to the substrate surface using an anisotropic etching method (as shown in FIG. 22A), and, after crystallizing the silicon films 303, vertical etching is performed also using the anisotropic etching method (as shown in FIG. 22B).

Figure 23A:
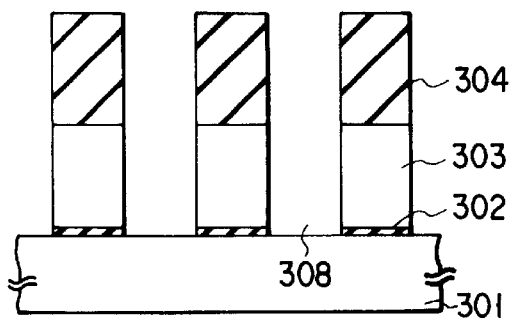
FIGS. 23A and 23B are views, useful in explaining, in a stepwise manner, another modification of the method for manufacturing NAND type EEPROM cells according to the third embodiment.
Figure 23B:
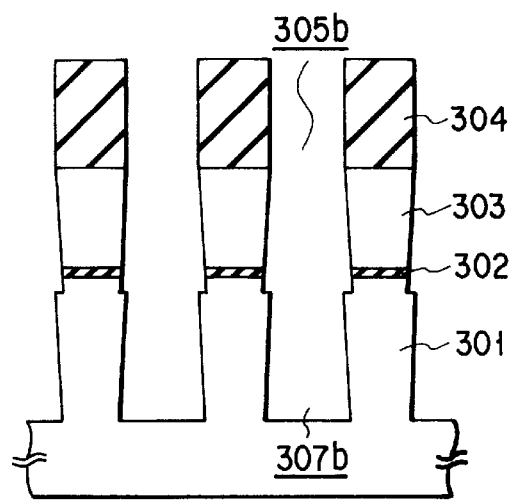

There is another method for completely isolating the substrate from the floating gate electrodes, in which the grooves 305 are formed in the process shown in FIGS. 17A and 17B (as shown in FIG. 23A), and then inversely tapered grooves 305b and 307b are formed by performing oblique etching with respect to the substrate surface (as shown in FIG. 23B).

Figure 24A:
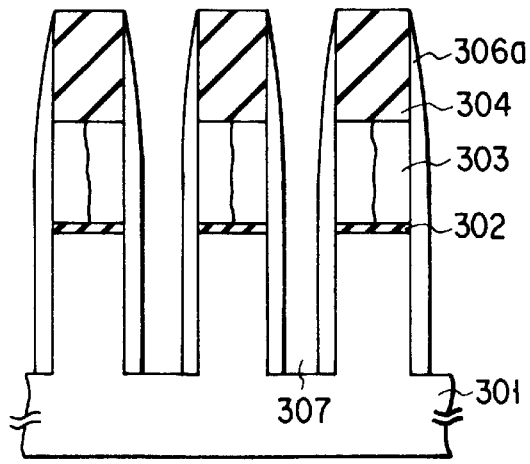
FIGS. 24A and 24B are views, useful in explaining, in a stepwise manner, a yet further modification of the method for manufacturing NAND type EEPROM cells according to the third embodiment.
Figure 24B:
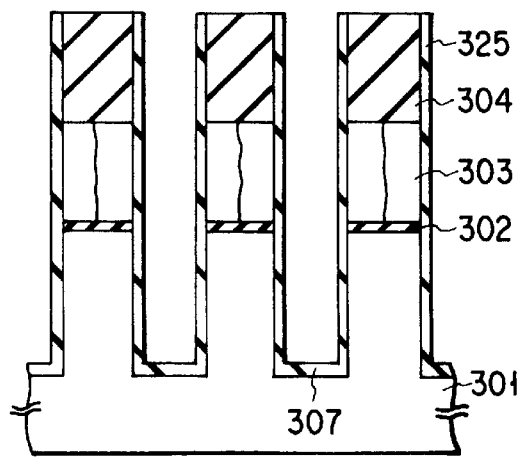
Figures 25A, 25B:
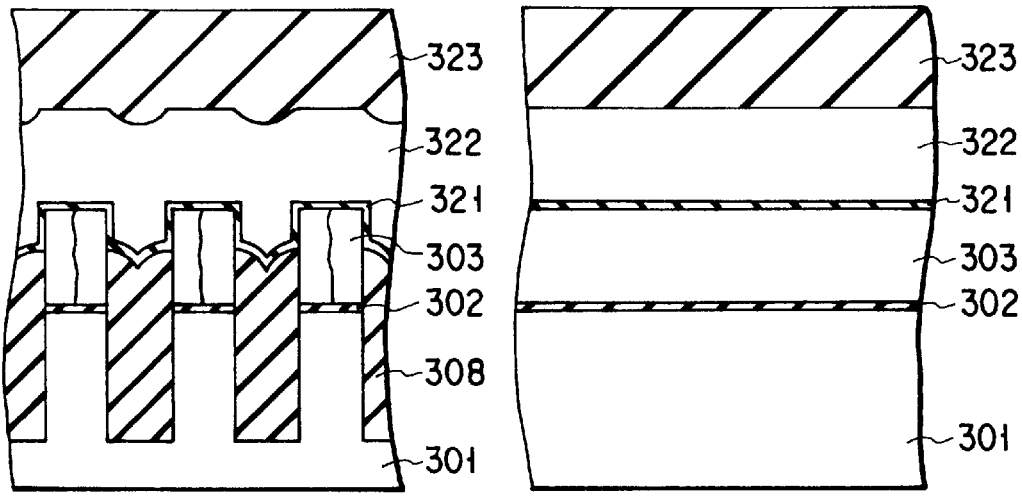

There is yet another method, in which the grooves 307 are formed by performing vertical etching with respect to the substrate surface as shown in FIG. 24A, and then silicon oxide films 325 are formed by oxidizing silicon films 306a left on side surfaces of the grooves 307 as shown in FIG. 24B.

Although in the third embodiment, only reactive ion etching as anisotropic etching is performed to form the grooves 307, a combination of anisotropic etching and isotropic etching may be used.

For example, the invention may be modified such that the oxide films 304 are exposed by isotropic etching using a down-flow type radical, and then the substrate 301 is etched by reactive ion etching to form the grooves 307. As a result, the silicon film will not easily remain on the side surfaces of the grooves.

Moreover, the invention may be modified such that the grooves 307 are formed by etching the substrate 301 by reactive ion etching, and then the silicon film which remains on surface portions of the grooves are removed by isotropic etching using a down-flow type radical.

(Fourth Embodiment)

A method for producing a NAND type EEPROM memory cell array according to a fourth embodiment will be described. The plan view of this memory cell array is similar to that shown in FIG. 2. FIGS. 25A, 26A, 27A, 28A, and FIGS. 25B, 26B, 27B, 28B are sectional views respectively corresponding to the sectional views taken along lines 8A—8A and 8B—8B of FIG. 2, and illustrating the method in a stepwise manner.

The method of the fourth embodiment can make not only floating gate electrodes but also control gate electrodes substantially identical in terms of the number of crystal grains contained therein and in terms of crystal grain shape, volume (size), and orientation of crystal grains.

The process steps in the third embodiment shown in FIGS. 16A, 16B to 20A, 20B are commonly used in the fourth embodiment. Note that FIG. 2 corresponds to a plan view at the step shown in FIGS. 21A and 21B. In the fourth embodiment, after these common process steps, an oxide film 321 with a thickness of 5 nm which serves as an interelectrode dielectric film, and an amorphous silicon film 322 with a thickness of 300 nm which will constitute control gate electrodes are deposited, by CVD, on the overall surface of the resultant structure in this order. Subsequently, an oxide film 323 with a thickness of 300 nm is deposited on the amorphous silicon film 322 by atmospheric-pressure CVD. (see FIGS. 25A and 25B)

Figures 26A, 26B:
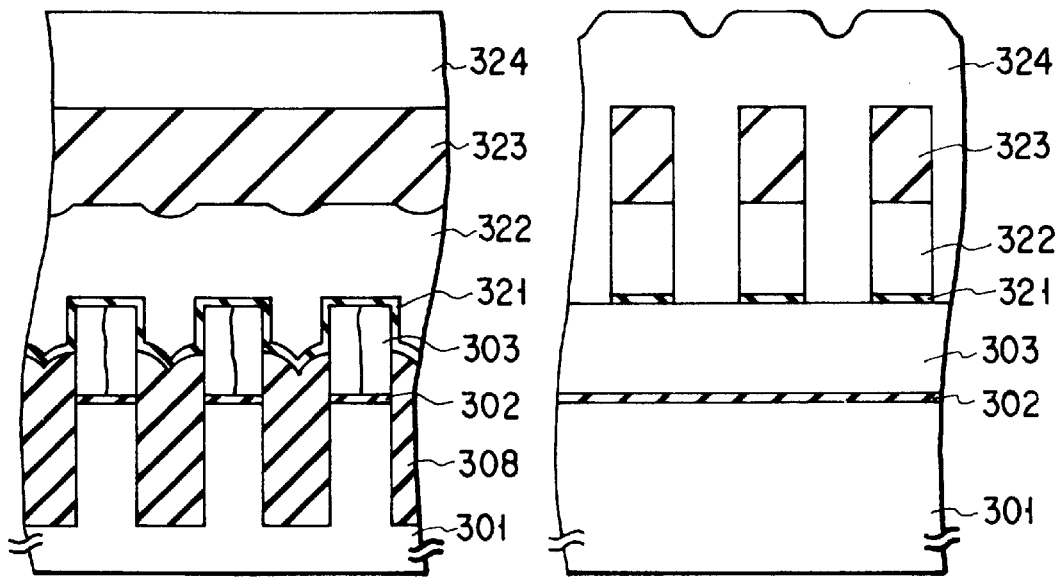

Thereafter, as is shown in FIGS. 26A and 26B, the oxide film 323, the amorphous silicon film 322 and the oxide film 321 are etched in this order by reactive ion etching, using a photoresist pattern (not shown) as a mask. Then, an amorphous silicon film 324 with a thickness of 200 nm is deposited on the overall surface of the resultant structure by CVD.

Then, as is shown in FIGS. 27A and 27B, the resultant structure is heated in the atmosphere of $N_2$ of 600° C. for 4 hours, thereby crystallizing the amorphous silicon films 322 and 324 to form polysilicon films. The crystallization of the silicon films is performed using the floating gate electrodes 303 as seed crystals.

Therefore, as in the case of the floating gate electrodes 303, the control gate electrodes 322 can be made substantially identical in terms of the number of crystal grains contained therein and in terms of crystal grain shape, volume (size), and orientation of crystal grains, thereby reducing the variance in coupling ratio.

Thereafter, the silicon films 324, 322 and 303 are etched in this order by reactive ion etching, using the oxide film 323 as a mask, thereby removing the silicon film 324, and patterning the silicon film 322 to the control gate electrodes and the silicon film 303 to the floating gate electrodes.

Lastly, as shown in FIGS. 28A and 28B, n-type source/drain regions 313 are formed in a self-alignment manner by implanting, for example, arsenic ions as n-type impurity ions into the substrate surface using the control gate electrodes 322 as masks, and then a heat treatment is performed in the atmosphere of oxygen of 850° C. to activate the impurity, thus completing the NAND type EEPROM memory cell array.

(Fifth Embodiment)

FIGS. 29A–29F are sectional views, useful in explaining, in a stepwise manner, a method for producing a MOS transistor according to a fifth embodiment of the invention. Although the first through fourth embodiments are directed to MOSFETs of a double gate structure, the MOSFEET employed in the fifth embodiment is a usual one of a single gate structure.

Figure 29A:
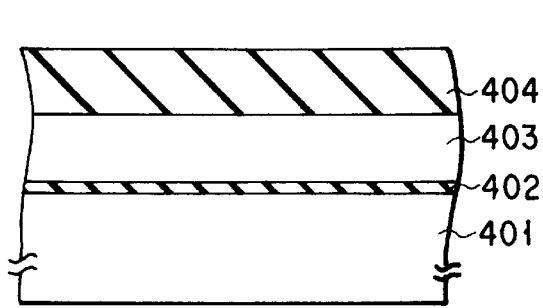
FIGS. 29A–29F are views, useful in explaining, in a stepwise manner, a method for manufacturing a MOS transistor according to a fifth embodiment of the invention.

First, as is shown in FIG. 29A, a gate oxide film 402, a silicon film 403 which will constitute a first gate electrode element, and a silicon oxide film 404 which will be used as an etching mask are formed on a p-type silicon substrate 401 in this order.

Figure 29D:
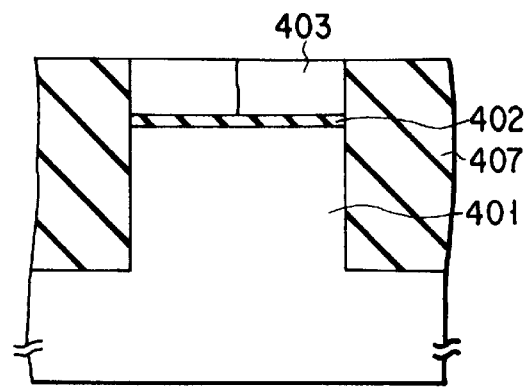
Figure 29B:
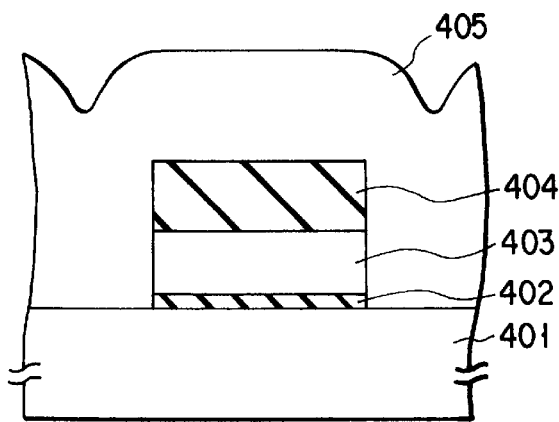

Then, as is shown in FIG. 29B, the films 402–404 are etched to form a gate section, and thereafter an amorphous silicon film 405 is formed on the overall surface of the resultant structure so as to cover the gate section. Subsequently, the amorphous silicon film 405 is crystallized using the p-type silicon substrate 401 as a seed crystal, and the amorphous silicon film 403 is crystallized using the crystallized silicon film 405 as a seed crystal. After the amorphous silicon film 403 is crystallized, the crystallized silicon film 405 is removed.

Figure 29E:
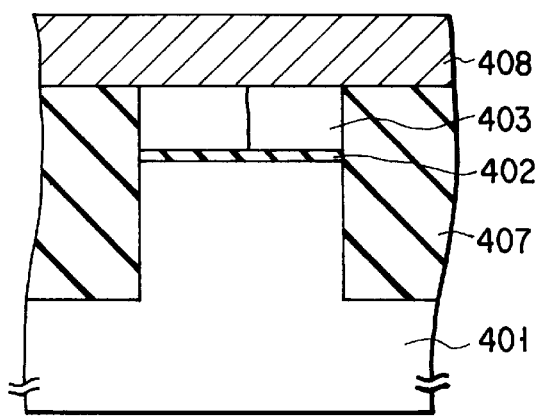
Figure 29C:
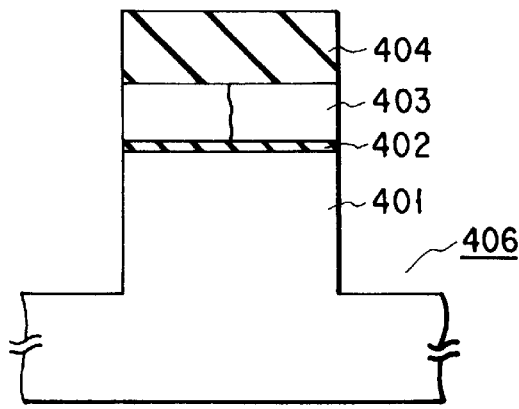

Thereafter, as is shown in FIG. 29C, the surface of the substrate is etched using the silicon oxide film 404 as a mask, thereby forming an element isolating groove 406.

Then, as is shown in FIG. 29D, an element isolating dielectric film 407 is formed of a silicon oxide film on the overall surface of the resultant structure. The element isolating film 407 is removed to the level of the silicon film 403 by chemical mechanical polishing or etching back. As a result, the silicon oxide film 404 is removed.

Thereafter, as is shown in FIG. 29E, a tungsten film 408 which will constitute a second gate electrode element is formed.

Figure 29F:
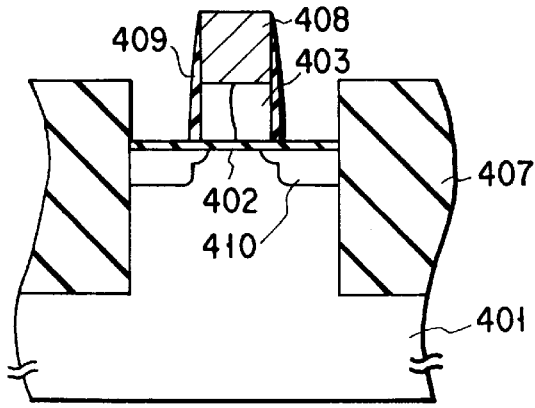

As is shown in FIG. 29F, the tungsten film 408 and the silicon film 403 are sequentially etched to form a gate electrode of a laminated structure (which consists of the first electrode element formed of the silicon film 403 and the second electrode element formed of the tungsten film 408). Lastly, a gate side wall dielectric film 409 and an n-type source/drain diffusion layer 410 of an LDD structure are formed by the known method, which is the completion of the MOS transistor.

The fifth embodiment also can reduce the variance in element characteristics due to variance in the crystal grains of the first gate electrode elements of memory cells.

The invention is not limited to the above-described embodiments. Although the embodiments are directed to NAND type memory cell arrays, the invention is also applicable to a memory cell array of other type.

Since as described above in detail, all semiconductor elements are substantially identical in terms of the number of crystal grains contained in each gate electrode, variance in element characteristics due to variance in the number of crystal grains can be restrained.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

We claim:

1. A semiconductor device comprising:

a semiconductor substrate; and a plurality of semiconductor elements provided on the semiconductor substrate, each of the semiconductor elements including:

a gate dielectric film formed on the semiconductor substrate;

a gate electrode formed on the semiconductor substrate with the gate dielectric film interposed therebetween, and having a pair of side surfaces; and source/drain regions formed in a surface of the semiconductor substrate along the pair of the side surfaces, wherein the gate electrode contains only two crystal grains, and the number of the crystal grains is substantially equal to the number of crystal grains contained in any other gate electrode of all the plurality of semiconductor elements.

2. The semiconductor device according to claim 1, further comprising a plurality of element isolating regions for isolating adjacent ones of the plurality of semiconductor elements.

3. The semiconductor device according to claim 2, wherein there is a step between a surface of each of the element isolating regions and a surface of the semiconductor substrate which is adjacent to each of the element isolating regions and on which the gate dielectric film is formed.

4. The semiconductor device according to claim 2, wherein the number of the crystal grains is two, and a grain boundary of the two crystal grains is located at a substantially center of a length of that portion of the semiconductor substrate which is situated between corresponding pair of the element isolating regions.

5. The semiconductor device according to claim 2, wherein a width of the gate electrode is set to be a predetermined width and a center of said gate being centered between corresponding pair of adjacent ones of the plurality of element isolation regions.

6. The semiconductor device according to claim 1, wherein the crystal grains of all the plurality of semiconductor elements have substantially the same shape and volume.

7. The semiconductor device according to claim 1, wherein the crystal grains of all the plurality of semiconductor elements have substantially the same orientation.

8. The semiconductor device according to claim 1, wherein each of the crystal grains of all the plurality of semiconductor elements has a plane substantially equal to a crystal plane of the semiconductor substrate.

9. A semiconductor device comprising:

a semiconductor substrate; and a plurality of semiconductor elements provided on the semiconductor substrate, each of the semiconductor elements including:

a gate dielectric film formed on the semiconductor substrate;

a floating gate electrode formed on the semiconductor substrate with the gate dielectric film interposed therebetween;

an interelectrode dielectric film formed on the floating gate electrode;

a control gate electrode formed on the interelectrode dielectric film; and source/drain regions formed in a surface of the semiconductor substrate along the both sides of the floating gate electrode, wherein at least one of the floating gate electrode and the control gate electrode contains two crystal grains, and the number of the crystal grains contained in the at least one of the floating gate electrode and the control gate electrode is substantially equal to the number of crystal grains contained in any other corresponding one of the floating gate electrode and the control gate electrode of all the plurality of semiconductor elements.

10. The semiconductor device according to claim 9, further comprising a plurality of element isolating regions for isolating adjacent ones of the plurality of semiconductor elements.

11. The semiconductor device according to claim 10, wherein the number of the crystal grains is two, and the grain boundary of the two crystal grains is located at a substantially center of a length of that portion of the semiconductor substrate which is situated between corresponding pair of the plurality of element isolating regions.

12. The semiconductor device according to claim 9, wherein the crystal grains of all the plurality of semiconductor elements have substantially the same shape and volume.

13. The semiconductor device according to claim 9, wherein the crystal grains of all the plurality of semiconductor elements have substantially the same orientation.

14. The semiconductor device according to claim 9, wherein each of the crystal grains of all the plurality of semiconductor elements has a plane substantially equal to a crystal plane of the semiconductor substrate.

* * * * *